United States Patent
Zeng et al.

(10) Patent No.: US 10,818,702 B2
(45) Date of Patent: Oct. 27, 2020

(54) ARRAY SUBSTRATES AND DISPLAY SCREENS

(71) Applicant: YUNGU (GU' AN) TECHNOLOGY CO., LTD., Langfang (CN)

(72) Inventors: Xianxiang Zeng, Langfang (CN); Siming Hu, Langfang (CN)

( * ) Notice: Subject to any disclaimer, the term of this patent is extended or adjusted under 35 U.S.C. 154(b) by 0 days.

(21) Appl. No.: 16/503,484

(22) Filed: Jul. 4, 2019

(65) Prior Publication Data

US 2019/0333940 A1    Oct. 31, 2019

Related U.S. Application Data

(63) Continuation of application No. PCT/CN2018/091859, filed on Jun. 19, 2018.

(30) Foreign Application Priority Data

Nov. 30, 2017   (CN) ..................... 2017 2 1644649 U

(51) Int. Cl.
*H01L 27/12* (2006.01)
*G09F 9/30* (2006.01)

(52) U.S. Cl.
CPC ............ *H01L 27/1244* (2013.01); *G09F 9/30* (2013.01); *H01L 27/1203* (2013.01)

(58) Field of Classification Search
CPC ............. H01L 27/1244; H01L 27/1203; H01L 27/3276; H01L 2251/5338; H01L 27/3258; G09F 9/30
USPC ....................................................... 257/72
See application file for complete search history.

(56) References Cited

U.S. PATENT DOCUMENTS

2007/0059610 A1*  3/2007  Jeong ................... G03F 1/36
                                                        430/5
2017/0262109 A1*  9/2017  Choi .................. G06F 3/0412
2017/0309652 A1  10/2017  Qian

FOREIGN PATENT DOCUMENTS

| CN | 106935631 A | 7/2017 |
|----|-------------|--------|
| CN | 206332028 U | 7/2017 |
| CN | 206400960 U | 8/2017 |
| CN | 206685061 U | 11/2017 |
| CN | 107910336 A | 4/2018 |
| WO | 2019105012 A1 | 6/2019 |

* cited by examiner

*Primary Examiner* — Vu A Vu
(74) *Attorney, Agent, or Firm* — Kilpatrick Townsend & Stockton

(57) ABSTRACT

The present disclosure relates to an array substrate including: an inorganic film layer having a surface provided with a number of first grooves; and metal wiring located in the first grooves. According to the array substrate described above, the surface of the inorganic film layer is provided with a number of first grooves, and the metal wiring is located in the first grooves, such that the inorganic film layer at the metal wiring is thinned, with reduced bending stress. On the other hand, the first grooves can release the bending stress of the array substrate partially during bending, thereby effectively preventing breakage of the inorganic film layer caused by bending, and thus effectively preventing breakage of the metal wiring, to improve reliability of the array substrate.

18 Claims, 4 Drawing Sheets

ARRAY SUBSTRATES AND DISPLAY SCREENS

CROSS-REFERENCES TO RELATED APPLICATIONS

This disclosure is a continuation application for International Application PCT/CN2018/091859, filed on Jun. 19, 2018, which claims the priority benefit of Chinese Patent Application No. 201721644649.2, titled "ARRAY SUBSTRATE AND DISPLAY SCREEN" and filed on Nov. 30, 2017. The entireties of both applications are incorporated by reference herein for all purposes.

BACKGROUND

A display screen may include an active area (AA) and a non-active area (non-AA). In order to realize certain functions, the active area or non-active area of the display screen is required to be bendable. For example, in order to realize a narrow bezel, the non-active area is bent to the back of the screen to reduce the width of the bezel.

SUMMARY

In view of above, it is needed to provide array substrates capable of preventing breakage of the metal wiring effectively and display screens with the same.

An exemplary embodiment of the present disclosure provides an array substrate, including: an inorganic film layer having a surface provided with a plurality of first grooves; and a metal wiring located in the first grooves.

According to the array substrate described above, the surface of the inorganic film layer is provided with a plurality of first grooves, and the metal wiring is located in the first grooves, such that the inorganic film layer at the metal wiring is thinned, with reduced bending stress. On the other hand, the first grooves can release the bending stress of the array substrate partially during bending, thereby effectively preventing breakage of the inorganic film layer caused by bending, and thus effectively preventing breakage of the metal wiring, to improve reliability of the array substrate.

In an embodiment, the array substrate includes a non-active area bent along a bending line, and the first groove extends through the bending line of the non-active area of the array substrate.

In an embodiment, the first groove extends along a direction perpendicular to the bending line of the non-active area.

In an embodiment, a depth of the first groove is greater than a thickness of the metal wiring, and less than a thickness of the inorganic film layer.

In an embodiment, the first groove has a cross section in a shape of a semicircle, a rectangle or a trapezoid.

In an embodiment, the array substrate further includes a stress buffer layer provided in the first grooves and formed on a surface of the metal wiring.

In an embodiment, the stress buffer layer includes an organic buffer layer.

In an embodiment, the stress buffer layer includes a photosensitive glue layer or an acrylic layer.

In an embodiment, the inorganic film layer includes a gate insulating layer, a dielectric layer and an interlayer insulating layer. The dielectric layer is located between the gate insulating layer and the interlayer insulating layer. The first groove is located on a surface of the interlayer insulating layer away from the dielectric layer. A surface of the gate insulating layer adjacent to the dielectric layer is provided with a plurality of second grooves. The array substrate further includes an auxiliary metal wiring layer located in the second grooves.

In an embodiment, the inorganic film layer is provided with a plurality of first recesses having an interval to the first grooves.

In an embodiment, one first recess is provided between each two first grooves.

In an embodiment, the array substrate further includes a first filling layer provided in the first recesses.

In an embodiment, the first filling layer includes a soft organic material.

In an embodiment, the first recess is in a shape of a groove, a cylinder or an inverted cone.

In an embodiment, the first recess includes a cross section in a shape of a triangle, a trapezoid or a rectangle.

In an embodiment, a plurality of second recesses located on the surface of the gate insulating layer adjacent to the dielectric layer is provided between the second grooves. The second recesses are filled with a second filling layer.

In an embodiment, the first recesses are located on a surface of the interlayer insulating layer away from the dielectric layer.

The present disclosure further provides a display screen. The display screen includes the array substrate provided by the present disclosure.

The display screen described above includes the array substrate provided by the present disclosure, the configuration of the array substrate may prevent breakage of the metal wiring effectively, thereby better guaranteeing transmission of signals and extending a service life of the display screen.

DETAILED DESCRIPTION OF THE INVENTION

As explained above, for a conventional display screen, the metal wiring is easy to be broken during bending, thereby resulting in a defective screen.

In order to make the objects, technical solutions and advantages of the present disclosure more comprehensible, the present disclosure will be described in detail below with reference to the accompanying drawings and embodiments. It should be understood that the detailed embodiments described herein are merely to explain the present disclosure, but not intended to limit the same.

It should be noted that when an element is referred to as being "provided on" another element, it can be provided directly on the other element or an interposing element can be present. When an element is deemed to be "connected" to another element, it can be connected directly to the other element or an interposing element can be present at the same time. The terms "vertical", "horizontal", "left", "right" and the like are used herein merely for the purpose of illustration, and are not intended to refer to an only embodiment.

Unless otherwise defined, all technical and scientific terms as used herein have the same meaning as commonly understood by those skilled in the art to which this disclosure belongs. The terms as used herein in the description of the present disclosure are merely for the purpose of describing particular embodiments, and are not intended to limit the present disclosure. The term "and/or" as used herein includes arbitrary and all combinations of one or more of the associated listed items.

Figure 1:
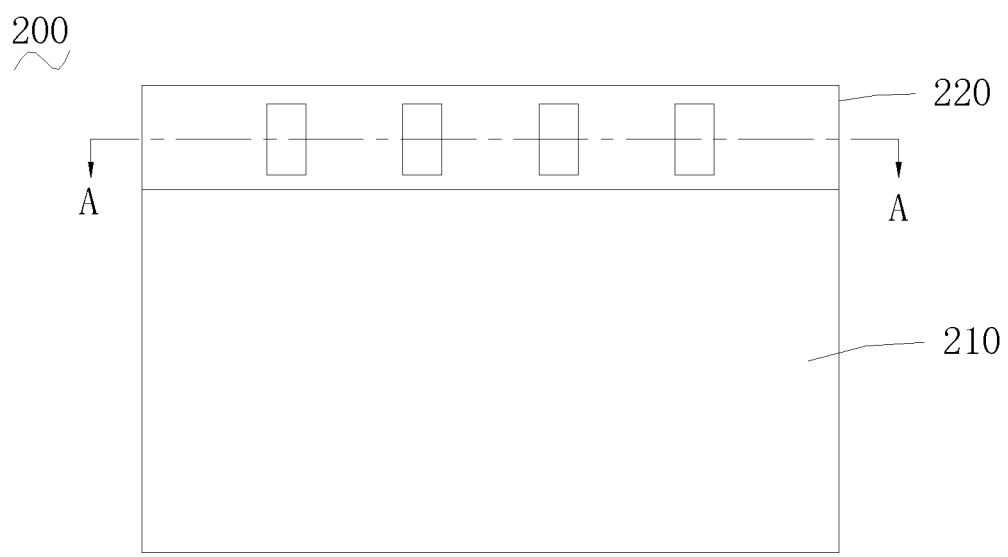
FIG. 1 is a top view of an array substrate according to an embodiment of the present disclosure.
Figure 2:
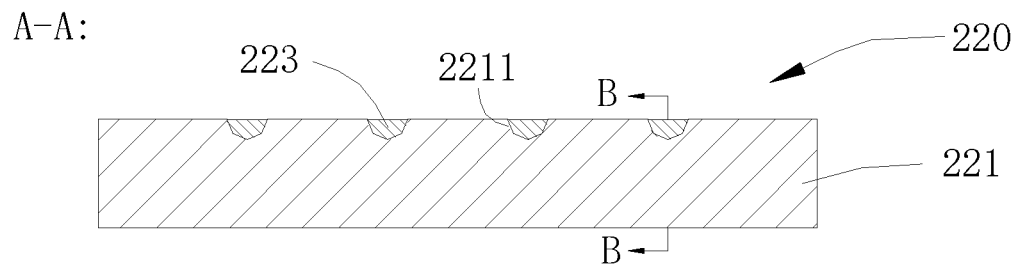
FIG. 2 is a schematic cross-sectional view of a non-active area of the array substrate taken along a line A-A in FIG. 1.
Figure 3:
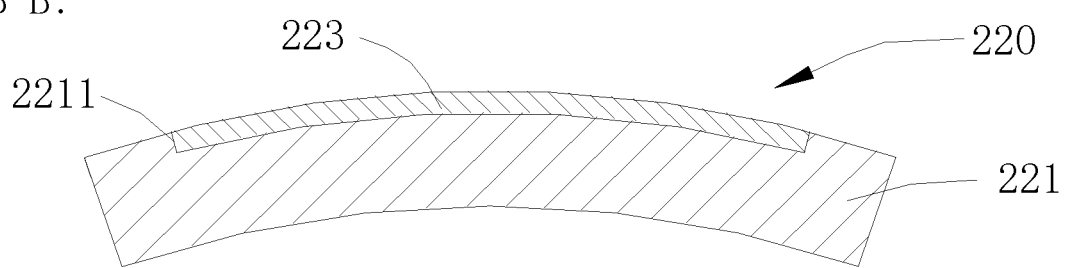
FIG. 3 is a schematic cross-sectional view of the non-active area of the array substrate taken along a line B-B in FIG. 2 when the non-active area is bent.

FIG. 1 to FIG. 3 show an array substrate 200 provided by an embodiment of the present disclosure, which includes an active area (i.e., AA) 210 and a non-active area (i.e., non-AA) 220 located outside the active area 210.

The active area (i.e., AA) 210 is an area of the array substrate 200 corresponding to pixel units. Electronic elements for driving the pixel units such as thin-film transistors, capacitors or others are provided within the active area 210. The non-active area (i.e., non-AA) 220 is located on an outer side of a side edge of the active area 210. The non-active area 220 may be located on an outer side of any one or more side edges of the active area 210.

The array substrate 200 includes an inorganic film layer and a metal wiring. A plurality of first grooves is provided on a surface of the inorganic film layer, and the metal wiring is located in the first grooves 2211. Specifically, the first grooves may be provided on both the surface of the inorganic film layer within the active area 210 and the surface of the inorganic film layer within the non-active area 220 of the array substrate 200, such that the metal wiring located within both the active area 210 and the non-active area 220 may be located in the first grooves 2211.

The first grooves cause the inorganic film layer at the metal wiring to be thinned, with reduced bending stress. On the other hand, the first grooves can release the bending stress of the array substrate 200 during bending, thereby effectively preventing breakage of the inorganic film layer caused by bending, and thus effectively preventing breakage of the metal wiring, to improve reliability of the array substrate 200.

The non-active area will be described in details below as an example.

In this embodiment, the non-active area 220 is bent in a direction perpendicular to and away from the surface of the inorganic film layer 221 having first grooves 2211. Specifically, the bending line of the non-active area 220 is indicated by a dash-dot line in FIG. 1. The non-active area 220 is bent along the bending line, and the bending direction of the non-active area 220 is directed to a direction opposite to the surface of the non-active area 220 shown in FIG. 1.

In this embodiment, the bending line of the non-active area 220 is parallel to a side edge of the active area 210 adjacent to the non-active area 220, and is located at a position proximate to a center of the non-active area 220. The bending line of the non-active area 220 is not limited thereto, and can also be along other directions or be located at other positions, for example being tilted with a certain angle or being translated in respect to the bending line in this embodiment.

In this embodiment, the first grooves 2211 extend along a direction perpendicular to the bending line of the non-active area 220, and pass through the bending line of the non-active area 220. In such a way, the first grooves 2211 can release more bending stress, thereby effectively preventing the breakage of the inorganic film layer 221 caused by bending, and thus effectively preventing the breakage of the metal wiring 223. If the first groove 2211 does not pass through the bending line of the non-active area 220, the first groove 221 will not be bend and of course without any bending stress when the non-active area 220 is bent, and thus not requiring the first groove 2211 to release the bending stress, that is, the effect of providing the first groove 2211 is lost. Therefore, it has to ensure that the first groove 2211 passes through the bending line of the non-active area 220 so as to effectively prevent the breakage of the inorganic film layer 221 caused by bending.

The first groove 2211 is not limited to extending along the direction perpendicular to the bending line of the non-active area 220, but can also extend along other directions or extend along a curve.

In this embodiment, a depth of the first groove 2211 is greater than a thickness of the metal wiring and less than a thickness of the inorganic film layer, such that the thickness of the inorganic film layer 221 at the first groove 2211 satisfies that stress applied on the inorganic film layer during bending do not cause the inorganic film layer 221 to be broken.

In this embodiment, the cross section of the first groove 2211 is in a shape of a semicircle. The semicircular groove is in a natural shape formed by an etching process which is simple, without any special design. The shape of the cross section of the first groove 2211 is not limited to the semicircle, but can also be a rectangle, trapezoid or other shapes.

In this embodiment, the first grooves 2211 have a same depth and can be manufactured simply. It should be noted that the depth of the first groove 2211 can be configured according to different bending stress at bending positions. The depth of the first groove 2211 is larger at a position where bending stress is larger, and the depth of a first groove 2211 is smaller at a position where bending stress is smaller, that is, the depths of the first grooves 2211 may not be exactly the same.

Figure 4:
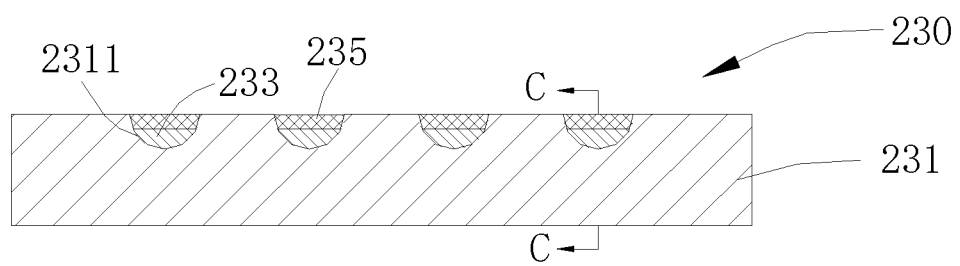
FIG. 4 is a schematic cross-sectional view of a non-active area of an array substrate according to Embodiment Two of the present disclosure.
Figure 5:
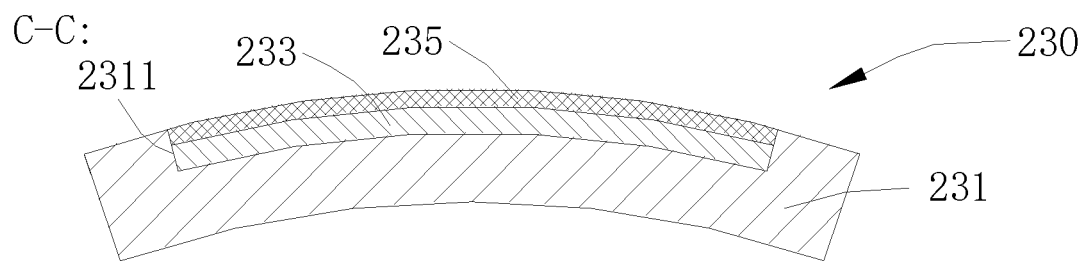
FIG. 5 is a schematic cross-sectional view of the non-active area of the array substrate taken along a line C-C in FIG. 4 when the non-active area is bent.

FIG. 4 and FIG. 5 show an array substrate provided by Embodiment Two of the present disclosure. Different from the array substrate 200, the non-active area 230 further includes a stress buffer layer 235 provided in the first groove 2311 and formed on the surface of the metal wiring 233.

The stress buffer layer 235 may release the bending stress of the non-active area 230 during bending, thereby effectively preventing the breakage of the inorganic film layer 231 caused by bending, and thus effectively preventing the breakage of the metal wiring 233.

In this embodiment, the stress buffer layer 235 is an organic buffer layer. Specifically, the stress buffer layer 235 is made from a flexible material such as photosensitive glue, acrylic or the like.

Figure 6:
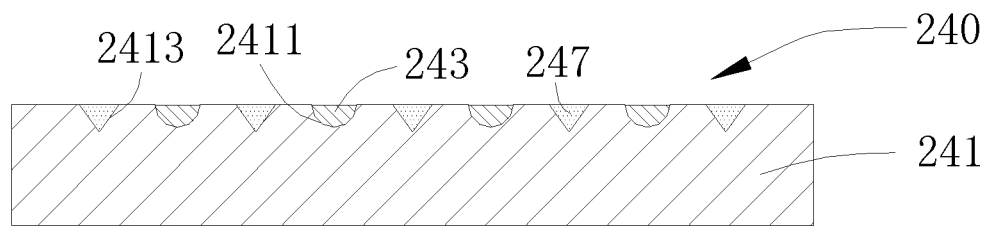
FIG. 6 is a schematic cross-sectional view of a non-active area of an array substrate according to Embodiment Three of the present disclosure.

FIG. 6 shows an array substrate provided by Embodiment Three of the present disclosure. Different from the array substrate 200, the inorganic film layer 241 is provided with a plurality of recesses 2413 having an interval to the first groove 2411.

The recess 2413 can increase a stress release space of the inorganic film layer 241 without changing the thickness of the inorganic film layer 241, to prevent a stress concentration phenomenon of the inorganic film layer 241, thereby preventing the breakage of the inorganic film layer 241, and effectively preventing the breakage of the metal wiring 243.

Further, the recess 2413 has an interval to the first groove 2411, thereby preventing a short circuit between adjacent metal wirings 243.

Preferably, in this embodiment, a distance between the recess 2413 and the first groove 2411 is greater than 10 μm.

In this embodiment, the recess 2413 is located at an intermediate position between two first grooves 2411. It should be noted that the position of the recess 2413 is not limited thereto, but can also provide the recess 2413 at a position biased towards one first groove according to bending stress, or at a position located under the first groove 2411, or at other positions. When there is an inorganic film layer further provided on the metal wiring 243, it is also possible to provide a recess 2413 on the first groove 2411.

In this embodiment, a recess 2413 is provided between each two first grooves 2411. The number of recesses 2413 is not limited thereto, but can also provide a plurality of recesses between each two first grooves 2411, or provide a recess separated two first grooves 2411, or provide a plurality of recesses under the first groove 2411.

In this embodiment, the recess 2413 is groove-shaped. The shape of the recess 2413 is not limited to a groove, but can also be in a shape of a cylinder, invented cone or others.

Specifically, in this embodiment, the cross section of the recess 2413 is triangular. The shape of the cross section of the recess 2413 is not limited to a triangular, but can also be in a shape of a trapezoid, a rectangle or others.

In this embodiment, a filling layer 247 is provided inside the recess 2413, and configured to cushion the bending stress of the inorganic film layer.

The filling layer 247 is made of a soft material, such as an organic material. The filling layer 247 can release the bending stress of the inorganic film layer 241, further preventing the breakage of the inorganic film layer 241 caused by bending, and thus effectively preventing the breakage of the metal wiring 243.

Figure 7:
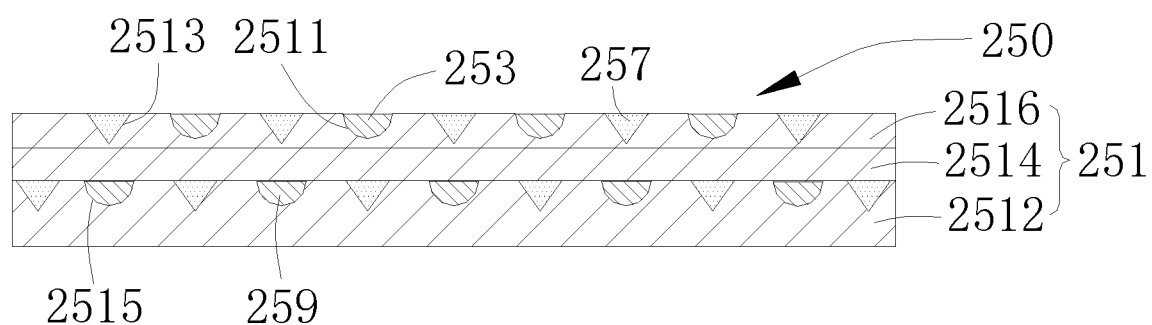
FIG. 7 is a schematic cross-sectional view of a non-active area of an array substrate according to Embodiment Four of the present disclosure.

As shown in FIG. 7, Embodiment Four of the present disclosure provides an array substrate. Different from the array substrate provided by Embodiment Three of the present disclosure, the non-active area 250 further includes an auxiliary metal wiring layer 259.

Specifically, the inorganic film layer 251 includes a gate insulating layer (GI layer) 2512, a dielectric layer (CI layer) 2514 and an interlayer insulating layer (ILD layer) 2516. The dielectric layer 2514 is located between the gate insulating layer 2512 and the interlayer insulating layer 2516. The first groove 2511 is located on a surface of the interlayer insulating layer 2516 away from the dielectric layer 2514. A plurality of second grooves 2515 is provided on a surface of the gate insulating layer 2512 adjacent to the dielectric layer 2514, and the auxiliary metal wiring layer 259 is provided in the second grooves 2515.

Preferably, in this embodiment, a plurality of recesses 2513 is also provided between the second grooves 2515, that is, a plurality of recesses 2513 is provided on the surface of the gate insulating layer 2512 proximate to the dielectric layer 2514. In order to prevent the material of the dielectric layer 2514 from being deposited in the recesses 2513 of the gate insulating layer 2512 when deposition of the dielectric layer 2514, in the recess 2513 of the gate insulating layer 2512 is provided a filling layer 257 for cushion the bending stress of the inorganic film layer 251. The filling layer 257 is made of a soft material, such as an organic material. The filling layer 257 can release the bending stress of the inorganic film layer 251, further preventing the breakage of the inorganic film layer 251 caused by bending, and thus effectively preventing the breakage of the metal wiring 253.

Preferably, in this embodiment, a plurality of recesses 2513 is provided between the first grooves 2511, that is, a plurality of recesses 2513 is provided on the surface of the interlayer insulating layer 2516 away from the dielectric layer 2514. Furthermore, it is also possible to provide the filling layer 257 in the recesses 2513 of the interlayer insulating layer 2516 to better release the bending stress of the inorganic film layer 251, further preventing the breakage of the inorganic film layer 251 caused by bending, and thus effectively preventing the metal wiring 253.

It should be noted that it is also possible to provide no filling layer 257 in the recesses 2513 of the interlayer insulating layer 2516, rather have to provide the filling layer 257 in the recesses 2513 of the gate insulating layer 2512, whereby it is possible to avoid the material of the dielectric layer 2514 from being deposited in the recesses 2513 of the gate insulating layer 2512.

Preferably, the configuration of the inorganic film layer and the metal wiring within the active area is identical to the configuration of the inorganic film layer and the metal wiring within the non-active area. Thereby, the inorganic film layer and the metal wiring within the active area and the non-active area can be formed by the same process.

Of course, when the active area has not to be bent, it is also possible to arrange the inorganic film layer and the metal wiring only within the non-active area in accordance with the configuration of the inorganic film layer and the metal wiring provided by the present disclosure.

Further, when bending conditions of the active area and the non-active area are different, it is also possible to arrange the inorganic film layer and the metal wiring corresponding to the active area and the non-active area in accordance with any one of the configurations of the inorganic film layer and the peripheral metal wiring provided by the present disclosure, based on the bending conditions.

The present disclosure provides a display screen, including the array substrate provided by the present disclosure.

It should be noted that the display screen further includes other devices in addition to the array substrate. The specific configurations of the other devices and the connection relationship between the devices can adopt well-known configurations to those skilled in the art, and will not be described herein.

The configuration of the array substrate provided by the present disclosure can prevent the breakage of the metal wiring effectively, thereby better guaranteeing transmission of signals and extending a service life of the display screen.

According to the array substrate described above, the surface of the inorganic film layer is provided with a plurality of first grooves, and the metal wiring is located in the first grooves, such that the inorganic film layer at the metal wiring is thinned, with reduced bending stress. On the other hand, the first grooves can release the bending stress of the array substrate partially during bending, thereby effectively preventing the breakage of the inorganic film layer caused by bending, and thus effectively preventing the breakage of the metal wiring, to improve the reliability of the array substrate.

All of the technical features in the embodiments described above can be employed in arbitrary combinations. For purpose of simplifying the description, not all arbitrary combinations of the technical features in the embodiments illustrated above are described. However, as long as such combinations of the technical features are not contradictory, they should be considered as within the scope of the disclosure in the specification.

The above embodiments are merely illustrative of several implementations of the disclosure, and the description thereof is more specific and detailed, but should not be construed as limitations to the scope of the present disclosure. It should be noted that variations and improvements will become apparent to those skilled in the art to which the present disclosure pertains without departing from its scope. Therefore, the scope of the present disclosure is defined by the appended claims.

The invention claimed is:

1. An array substrate comprising:
   an inorganic film layer having a surface provided with a plurality of first grooves; and
   a metal wiring located in the first grooves,
   wherein the inorganic film layer comprises a gate insulating layer, a dielectric layer and an interlayer insulating layer, the dielectric layer being located between the gate insulating layer and the interlayer insulating layer;
   the first groove is located on a surface of the interlayer insulating layer away from the dielectric layer;
   a plurality of second grooves is provided on a surface of the gate insulating layer adjacent to the dielectric layer; and
   the array substrate further comprises an auxiliary metal wiring layer located in the second grooves.

2. The array substrate of claim 1, wherein the array substrate comprises a non-active area bent along a bending line, and the first grooves extend through the bending line of the non-active area of the array substrate.

3. The array substrate of claim 2, wherein the first groove extends along a direction perpendicular to the bending line of the non-active area.

4. The array substrate of claim 1, wherein the first groove has a cross section in a shape of a semicircle, a rectangle or a trapezoid.

5. The array substrate of claim 1 further comprising a stress buffer layer provided in the first grooves and formed on a surface of the metal wiring.

6. The array substrate of claim 5, wherein the stress buffer layer comprises an organic buffer layer.

7. The array substrate of claim 6, wherein the stress buffer layer comprises a photosensitive glue layer or an acrylic layer.

8. The array substrate of claim 1, wherein the inorganic film layer is provided with a plurality of first recesses having an interval to the first grooves.

9. The array substrate of claim 1, wherein the inorganic film layer is provided with a plurality of first recesses having an interval to the first grooves.

10. The array substrate of claim 8, wherein one first recess is provided between each two first grooves.

11. The array substrate of claim 8, wherein the array substrate further comprises a first filling layer provided in the first recesses.

12. The array substrate of claim 11, wherein the first filling layer comprises a soft organic material.

13. The array substrate of claim 10, wherein the first recess is in a shape of a groove, a cylinder, or an inverted cone.

14. The array substrate of claim 10, wherein the first recess comprises a cross section in a shape of a triangle, a trapezoid or a rectangle.

15. The array substrate of claim 1, wherein a plurality of second recesses located on the surface of the gate insulating layer adjacent to the dielectric layer is provided between the second grooves, the second recesses being filled with a second filling layer.

16. The array substrate of claim 1, wherein the first recesses are located on a surface of the interlayer insulating layer away from the dielectric layer.

17. A display screen, comprising the array substrate according to claim 1.

18. The array substrate of claim 1, wherein a depth of the first groove is greater than a thickness of the metal wiring and less than a thickness of the inorganic film layer.

* * * * *